United States Patent [19]

Brunner

[11] Patent Number: 4,831,267
[45] Date of Patent: May 16, 1989

[54] DETECTOR FOR CHARGED PARTICLES

[75] Inventor: Matthias Brunner, Kirchheim, Fed. Rep. of Germany

[73] Assignee: Siemens Aktiengesellschaft, Berlin and Munich, Fed. Rep. of Germany

[21] Appl. No.: 147,338

[22] Filed: Jan. 22, 1988

[30] Foreign Application Priority Data

Feb. 16, 1987 [DE] Fed. Rep. of Germany ....... 3704865

[51] Int. Cl.⁴ .......................................... H01J 37/244
[52] U.S. Cl. .................... 250/397; 250/305; 250/306; 250/310; 250/368
[58] Field of Search ............... 250/397, 310, 368, 305, 250/306

[56] References Cited

U.S. PATENT DOCUMENTS 4,246,479 1/1981 Gopinathan ..................... 250/305

Primary Examiner—Bruce C. Anderson
Assistant Examiner—Jack I. Berman

[57] ABSTRACT

A detector for charged particles includes three grid electrodes arranged approximately parallel to the surface of a specimen and separated from one another by insulating spacers, as well as a charged particle sensitive part nearly completely covering the specimen. The particle sensitive part includes a plurality of rod shaped scintillators or light conductors lying at a high potential for post acceleration of secondary particles and lying in a plane approximately parallel to the surface of the specimen.

16 Claims, 1 Drawing Sheet

DETECTOR FOR CHARGED PARTICLES

BACKGROUND OF THE INVENTION

1. Field of the Invention

The present invention relates generally to a detector for charged particles including a plurality of particle sensitive regions.

2. Description of the Related Art

When a primary particle beam strikes a solid, secondary particles are emitted due to the interaction of the primary particles with the material of the solid. The energy distribution and angular distribution of the secondary particles are dependent on, among other things, the chemical and/or physical composition present at the interaction region, on the surface structure, and on the distribution of voltages present on the specimen. The secondary electrons triggered at surface proximate regions are of special significance for imaging in scanning electron microscopes.

The secondary electrons are documented, for example, with a detector arranged laterally above the specimen to be imaged. As a consequence of the asymmetrical arrangement of the detector which is usually composed of an extraction electrode, a scintillator, and of a light conductor within the specimen chamber, the detection probability of the secondary electrons and, thus, the signal level measured in the detector is decisively influenced by the point at which the secondary electrons are triggered on the specimen. See, for example, the Journal of Scientific Instrueuments, Volume 37, July 1960, pages 246 through 248.

A detector system including a plurality of individual detectors is disclosed in European Pat. No. 0 018 031. Such a multi-detector system is mainly used for investigating large area specimens to guarantee a largly symmetrical extraction of the secondary electrons which is independent of emission location and emission angle. These detector arrangements, however, have the disadvantage that a noise signal generated by back-scattered electrons is superimposed on the measured secondary electron signal. This is due to the total detector area which is multiplied in comparison to that of individual detectors.

SUMMARY OF THE INVENTION

An object of the present invention is to provide a detector for charged particles wherein the detection probability is independent of the trigger location of the particles or radiation on the specimen. Furthermore, a particle selective documentation is guaranteed by the present charged particle detector.

This and other objects of the present invention are achieved in a charged particle detector having particle sensitive regions arranged in a plane lying approximately parallel to the surface of the specimen and having an extent measured in the parallel plane roughly corresponding to the dimensions of the specimen.

An advantage are obtained with the present invention is, in particular, that no location-dependent disturbances caused by the detector geometry are superimposed on the topography, material or voltage contrast signal generated by the detector. Moreover, the contribution of backscattered particles to the measured signal is considerably reduced in the present detector.

Preferred developments and improvements in the invention include providing individual ones of the particle sensitive regions extending only over subregions of the parallel plane. These individual particle sensitive regions are preferably rod shaped particle sensitive regions arranged parallel to one another. An arrangement of electrodes is provided according to the invention in which a first electrode is arranged immediately under the particle sensitive regions, and a second electrode is arranged immediately above the particle sensitive regions and preferably immediately under a pole shoe of an imaging lens. A third electrode is preferably provided immediately under the first electrode, and voltages are applied to the second and third electrodes to decelerate charged particles to be documented by the detector.

Means for conducting signals generated in the particle sensitive regions are included and are, in one embodiment, in the form of light conductors. The first, second and third electrodes are preferably grid electrodes which have a spacing approximately that of the parallel arranged particle sensitive regions.

DESCRIPTION OF THE PREFERRED EMBODIMENTS

Figure 1:
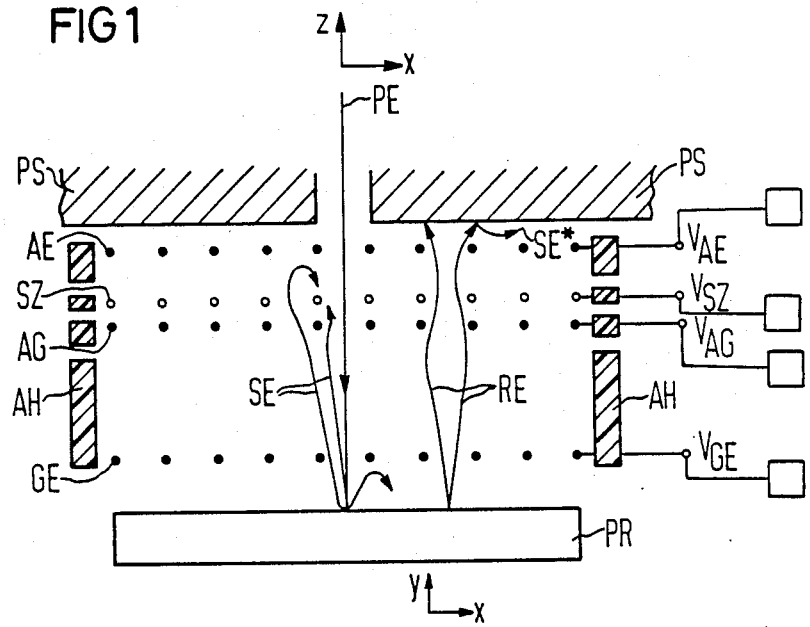
FIG. 1 is a cross section of an exemplary embodiment of a detector according to the principles of the present invention for energy sensitive documentation of secondary electrons.

A detector of the invention is shown schemmatically in FIG. 1 for documenting secondary electrons SE which, for example, are triggered on a specimen PR to be investigated. The secondary electrons SE are triggered on the specimen PR by a primary electron beam PE generated in a scanning electron microscope, as is known. The detector is arranged immediately under a pole piece PS of an objective lens of the scanning electron microscope, and is essentially composed of three lattice or grid electrodes GE, AG, and AE arranged approximately parallel to the surface of the specimen PR and separated from one another by insulating spacers AH. The detector is further composed of an electron-sensitive part which at least nearly completely covers the specimen PR in terms of its extent in a plane parallel to the specimen PR. The electron sensitive part includes a plurality of rod-shaped scintillators SZ or light conductors coated with a scintillator. The scintillators SZ lie at a high positive voltage $V_{SZ}$ of, for example, +10 kV. This provides post-acceleration of the secondary electrons SE which are emitted at low kinetic energies ($E_{SE} \leq 50$ eV). The scintillator rods SZ are likewise arranged in a plane parallel to the surface of the specimen PR. The length of the scintillator rods SZ respectively approximately corresponds to the dimensions of the specimen PR in the direction defined by the longitudinal axis of the respective rods SZ.

Figure 2:
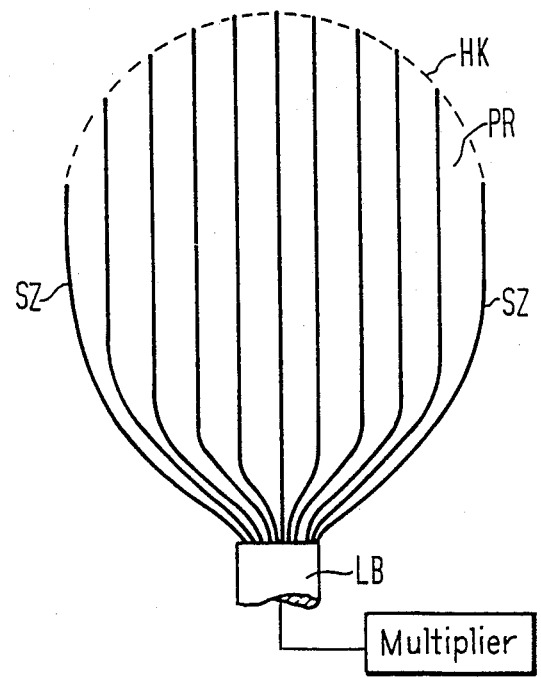
FIG. 2 is a schematic plan view of a structure including particle sensitive regions of the detector from FIG. 1.

As shown in FIG. 2, the envelope HK connecting the ends of the rods SZ, in one embodiment, assumes the shape of a semi-circle although the shape of the envelope HK can correspond to the boundry shape of any specimen PR being investigated.

The scintillator rods or light conductor rods SZ are preferably arranged parallel to one another at a constant spacing. To be able to convert the light pulses generated by the incident secondary electrons SE in the scintillator or light conductor rods SZ into an electrical signal in the known signal chain of a scanning electron microscope, the rods SZ are bundled together outside of the specimen region to be scanned and are preferrably supplied to a photocathode of a multiplier upon interposition of a light-permeable block or other light conductor LB.

To suppress local contributions of backscattered electrons RE, the detector is advantageously equipped with the first lattice or grid electrode AG lying at ground potential or at some negative potential $V_{AG}$. The first grid electrode AG is advantageously arranged immediately under the plane of the scintillator rods SZ and substantially parallel to the surface of the specimen PR. Since the lattice webs of the first grid electrode AG act as weakly focusing lenses, both the low energy secondary electrons ($E_{SE} \leq 50$ eV) as well as high energy backscattered electrons RE ($E_{RE} \simeq E_{PE}$ = the energy of the primary electrons $\simeq 3$ through 10 keV) are deflected in the direction of the rod interspaces.

In FIG. 1, different trigger points for backscattered electrons RE and secondary electrons SE are shown for reasons of clarity although they may be triggered generally in the same region. The merely weak deflection of the high energy backscattered electrons RE in the field of the first lattice or grid electrode AG is adequate to supress the extraction of the backscattered electrons RE in the direction of the scintillator rods or light conductors SZ lying at the positive potential $V_{SZ}$.

To also suppress signal contibutions of secondary electrons SE* triggered at the objective lens by incident backscattered electrons RE, a shielding grid AE lying at a negative potential $V_{AE}$ of, for example, $-50$ volts is arranged under the pole piece PS of the objective lens and substantially parallel to the plane of the scintillator rods Sz. The shielding grid or second grid electrode AE also promotes the action of the distraction field of the scintillator rods SZ, in that it repels the secondary electrons SE focussed in the direction of the rod interspaces back onto the scitillators SZ without significantly influencing the backscattered electrons RE. The number of secondary electrons SE* triggered at the objective lens can also be further reduced by coating the pole piece PS with carbon or with some other material having a low secondary electron yield.

To enable an energy sensitive documentation of the secondary electrons SE to be performed, the detector of the invention is equiped with an opposing field electrode GE arranged immediately above the specimen PR and approximately parallel to the surface thereof. This lattice or grid electrode GE lies at a variable, negative potential $V_{GE}$ to build up a potential wall that only secondary electrons SE having energies above a prescribed minimum energy can overcome. The lattice or grid electrode GE, thus, forms a third electrode in the detector arrangement.

A detector as described is especially required for electron beam testing of large area printed circuit boards, for example, having a size of about $10 \times 10$ cm, and of micro-wiring circuits where the average energy of a triggered secondary electron SE is interpreted as a measure of the voltage of the irradiated point on the specimen PR. The third electrode or opposing field electrode GE can possibly be omitted when the first lattice or grid electrode AG is charged with a potential defining the desired minimum energy for the passage of secondary electrons SE.

Given use of an opposing field electrode GE, the distance of the first grid electrode AG should be great in comparison to the spacing of its grid webs. Furthermore, the distance of the first grid electrode AG from the plane of the scintillator rods SZ should be selected as small as possible without falling below the minimum distance defined by the high voltage $V_{SZ}$ at the scintillator rods SZ, i.e. for safe operation. The spacing of the light conductor rods or scintillator rods SZ and their thickness, depends on, among other things, the size of the specimen PR. For example, the rod thickness can amount to a minimum of 1 mm and the rod spacing can amount to about 5 mm for a specimen area of $10 \times 10$ cm.

The invention, of course, is not limited to the exemplary embodiments shown in FIGS. 1 and 2. Thus, the lattice or grid electrodes can also be charged with other voltages. Their sizes must be calculated or experimentally determined for the selected grid dimensions. It is not necessary to use all of the electrodes shown in FIG. 1 in a detector of the invention. Thus, for example, the electrodes AG and AE can be omitted, whereby, however, one must then count on an increased noise signal due to the backscattered electrons RE.

In a preferred embodiment, the spacing of the webs of the grid electrodes approximately corresponds to the spacing between neighboring ones of the particle sensitive scintillator rods SZ. The extent of the first second and third electrodes AG, AE and GE, respectively, and of the scintillator rods SZ, lying in planes parallel to the surface of the specimen is preferrably sufficient to at least nearly completely cover the specimen PR.

Means for maintaining each of the electrodes AE, AG, and GE, as well as the particle sensitive part SZ, at the disclosed voltages are shown as block elements in FIG. 1. Such voltage means can include any known means for providing a voltage.

Although other modifications and changes may be suggested by those skilled in the art, it is the intention of the inventor to embody within the patent warranted hereon all changes and modifications as reasonably and properly come within the scope of his contribution to the art.

I claim:
1. A detector, comprising:
   a plurality of particle sensitive regions arranged in a plane lying approximately parallel to a surface of a specimen, said plurality of particle sensitive regions having an extent in a direction in a straight line in said plane approximately corresponding to dimensions of said specimen in said direction, said plurality of particle sensitive regions being rod shaped and being arranged parallel to one another, said plurality of particle sensitive regions being scintillators; and
   at least one means for forwarding signals generated by incident charged particles or radiation in ones of said particle sensitive regions.
2. A detector as claimed in claim 1, wherein ones of said plurality of particle sensitive regions extend only over sub-regions of said plane.
3. A detector as claimed in claim 1, wherein ones of said plurality of particle sensitive regions are scintillators each having a rod-shaped light conductor.
4. A detector as claimed in claim 1, further comprising:

a first electrode disposed approximately parallel to the surface of the specimen and immediately under said plurality of particle sensitive regions.

5. A detector as claimed in claim 4, further comprising means for maintaining said first electrode at no greater than ground potential.

6. A detector as claimed in claim 1, further comprising:
an electrode disposed approximately parallel to the surface of the specimen and immediately above said plurality of particle sensitive regions.

7. A detector as claimed in claim 6, further comprising:
a pole piece of an imaging lens of a beam generating system; and
said electrode being disposed immediately under said pole piece.

8. A detector as claimed in claim 1, furter comprising:
a first grid electrode;
another electrode disposed approximately parallel to the surface of the specimen and immediately under said first grid electrode.

9. A detector as claimed in claim 6, wherein said electrode is a second electrode, and further comprising:
a first electrode disposed approximately parallel to the surface of the specimen and immediately under said plurality of particle sensitive regions;
a third electrode disposed approximately parallel to the surface of the specimen and immediately under said first electrode; and
means for maintaining voltages at said second and third electrodes of plurality such that particles to be documented by said detector are decelerated.

10. A detector as claimed in claim 1, wherein said at least one means for forwarding is a first light conductor, and further comprising:
a second light conductor of cross section smaller than said first light conductor, said second light conductor connecting said first light conductor to said plurality of particle sensitive regions.

11. A detector as claimed in claim 10, wherein said first light conductor is a light conductor block.

12. A detector as claimed in claim 9, wherein a first distance between said first electrode and said third electrode and a second distance bewteen said second electrode and said plane of said particle sensitive regions is greater than a third distance between said first electrode and said plane of said particle sensitive regions.

13. A detector as claimed in claim 9, wherein said first electrode and said second electrode and said third electrode are each of an extent sufficient to at least nearly completely cover the surface of the specimen.

14. A detector as claimed in claim 9, wherein each of said first electrode and said second electrode and said third electrode are in the form of a grid electrode.

15. A detector as claimed in claim 14, wherein neighboring ones of said particle sensitive regions have a mutual spacing corresponding to a spacing of webs of said first grid electrode and said second grid electrode and said third grid electrode.

16. A detector comprising:
a plurality of particle sensitive regions arranged in a plane lying approximately parallel to a surface of a specimen, said plurality of particle sensitive regions having an extent in a direction in a straight line in said plane approximately corresponding to dimensions of said specimen in said direction, said plurality of particle sensitive regions being rod shaped and being arranged parallel to one another, said plurality of particle sensitive regions being light conductors coated with a scintillator; and
at least one mean for forwarding signals generated by incident charged particles or radiation in ones of said particle sensitive regions.

* * * * *